United States Patent
Burm et al.

[11] Patent Number: 5,932,379
[45] Date of Patent: Aug. 3, 1999

[54] REPAIRING FRACTURED WAFERS IN SEMICONDUCTOR MANUFACTURING

[75] Inventors: Jinwook Burm, Seoul, Rep. of Korea; Robert Alan Hamm, Staten Island, N.Y.; Rose Fasano Kopf, Greenbrook, N.J.; Robert William Ryan, Piscataway, N.J.; Alaric Tate, Chatham, N.J.

[73] Assignee: Lucent Technologies Inc., Murray Hill, N.J.

[21] Appl. No.: 09/028,966

[22] Filed: Feb. 24, 1998

[51] Int. Cl.⁶ .................................................. G03F 9/00
[52] U.S. Cl. .................... 430/22; 438/4; 430/30; 430/296; 430/942; 430/966

[58] Field of Search .................... 430/22, 30, 296, 430/942, 966; 438/4

*Primary Examiner*—Christopher G. Young

[57] ABSTRACT

The specification describes a technique for repairing wafer fractures that occur during wafer fabrication. The fractured pieces are joined edge-to-edge at the fracture line and bonded with epoxy adhesive. The method succeeds because the dimensions of the fracture line after bonding is within the reregistration tolerance of commercial step-and-repeat cameras and the reregistration capability of the camera allows normal exposure of sites that do not intersect the fracture line.

21 Claims, 2 Drawing Sheets

REPAIRING FRACTURED WAFERS IN SEMICONDUCTOR MANUFACTURING

FIELD OF THE INVENTION

This invention relates to semiconductor manufacturing and to techniques for salvaging broken wafers during wafer fabrication. It is also useful for bonding together substrates of different materials for monolithic integration.

BACKGROUND OF THE INVENTION

In the manufacture of semiconductor integrated circuits, specifically in wafer fabrication, cost of manufacture is significantly increased due to wafer breakage. While the problem exists in silicon IC manufacture, it is particularly severe in the fabrication of III-V semiconductor wafers, e.g. GaAs and InP. These materials are more fragile than silicon, and the fabrication of these wafers tends to be more complex and thus more expensive. Breakage of III-V wafers toward the end of the fabrication sequence is especially costly because of the value added to the wafer as processing proceeds. For example, typically the cost of processing an InP wafer is several thousand dollars, significantly more than the value of the wafer (typically~$300).

When wafer breakage occurs before processing is complete, the broken wafers are typically discarded. A method for salvaging broken semiconductor wafers in which significant processing investment has occurred would lower the cost of wafer fabrication.

STATEMENT OF THE INVENTION

We have developed a method for salvaging semiconductor wafers that are broken during the wafer fabrication process. The method relies in part on the ability of step and repeat lithography tools to reregister patterns at each chip site. Using such tools, the broken wafer can be adhesively bonded back together, and the wafer fabrication sequence continued. The bonding process according to the invention is edge-to-edge, thus retaining essentially the original thickness of the wafer. Bonding wafer segments or pieces to another whole substrate, while apparently as effective, renders the repaired wafer too thick for the normal depth of field of the stepper. The edge-to-edge bonding technique of the invention is advantageous because the repaired wafer has the same thickness as the original wafer, and essentially the same dimensions so that no adjustments need be made in any of the subsequent processing steps or tools. The preferred bonding material for the process is epoxy. The bonding technique can also be used to fabricate hybrid wafers having sections of different semiconductor materials so that device sites can include regions of different semiconductors. Different kinds of devices can then take advantage of the properties of different substrate materials. For example, photonic devices can be formed in one substrate material, e.g. InP, and transistor devices can be formed in another, e.g. GaAs.

DETAILED DESCRIPTION

Figure 1:
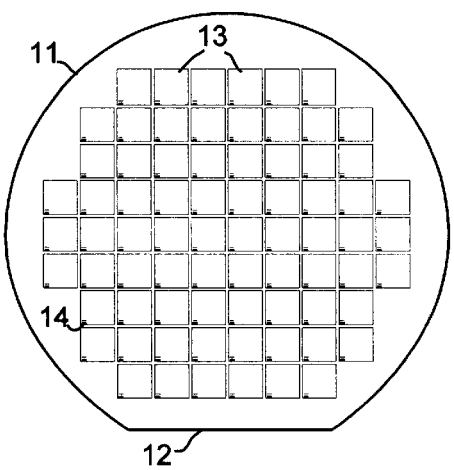
FIG. 1 is a schematic representation of a partially fabricated semiconductor wafer.

Referring to FIG. 1 a semiconductor wafer 11 is shown with conventional flat 12 and a large number of IC chip sites 13. The figures in this description are schematic representations of actual semiconductor wafers which may have more or fewer chip sites than shown here. The wafer illustrated has 74 chip sites.

In a conventional wafer fabrication process using step and repeat photolithography or e-beam lithography each chip site has alignment marks such as those represented at 14 in FIG. 1. These marks allow the stepper to reregister the photomask at each location. This is an important feature that contributes to the success of the technique of the invention.

Figure 2:
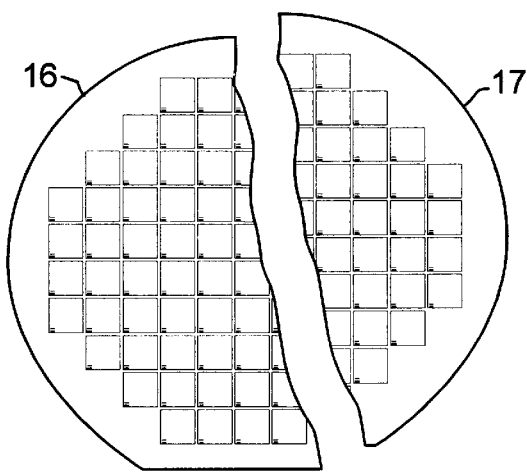
FIG. 2 is a representation of the wafer of FIG. 1 after accidental breakage.

With reference to FIG. 2, the wafer is shown in two pieces after accidental breakage. A single fracture, i.e. resulting in two pieces, is typical in a manufacturing environment. Breakage into more than two pieces may be encountered in which case repair by the technique of the invention gives diminishing returns. Frequently, breakage occurs in the late stages of processing, when much of the processing investment in the wafer has been made. The cost tradeoffs between the value of the wafer and the cost of repair suggest that wafers that have been through at least 25% of the wafer fabrication sequence will result in a return on processing investment. Typically, wafers will have been through at least one step and repeat lithographic step at this point. Almost invariably the fracture line intersects multiple chip sites as shown.

The repair technique of the invention involves edge-to-edge bonding of the fractured pieces. After edge-to edge bonding the wafer appears as in FIG. 3, with the fracture line visible at 18. The repaired wafer is then processed to completion as if the break did not occur. The stepper identifies the alignment marks at each site, and exposes the pattern in the conventional way. The patterns for the sites that are not intersected by the fracture line are completely normal, and fabrication of these sites is completed in the normal routine. Patterns for the sites marked with an "x" are distorted by the fracture line and the chips at these sites will be discarded after the singulation step. As seen from FIG. 3, a total of eleven chips from this wafer will be junked due to the fracture, but 63 chip sites, or 85% of the total, can be salvaged and processed to completion. The percentage of chips that are permanently lost in this repair process is partly a function of the total number of chips per wafer. Typically, the repair technique is effective with wafers having at least 16 chip sites, where at least approximately two thirds or 67% of the sites can be salvaged.

The repair technique was demonstrated and the details will be described here in the context of a process for the fabrication of III-V Double Heterostructure Bipolar Transistor (DHBT) devices. However, it will be appreciated by those skilled in the art that the fracture repair technique has broad application to semiconductor device wafers, particularly to III-V multilayer heterostructure device wafers.

Metal-organic molecular beam epitaxially grown InGaAs/InP HBT wafers were used for the demonstration. The wafers were processed through the multilayer growth sequence, thus ensuring that built-in stresses from the lattice mismatch between multiple layers of different materials, as well as thermal mismatch between these layers, would be present for the repair process and for subsequent processing. The substrates were 615 $\mu$m thick, and were oriented 2° off (100), towards the <11-1> direction. The substrates had a large flat as shown, and a smaller flat (not shown) oriented 45° to the large flat. The emitter level metal was initially patterned on the wafer.

Figure 4:
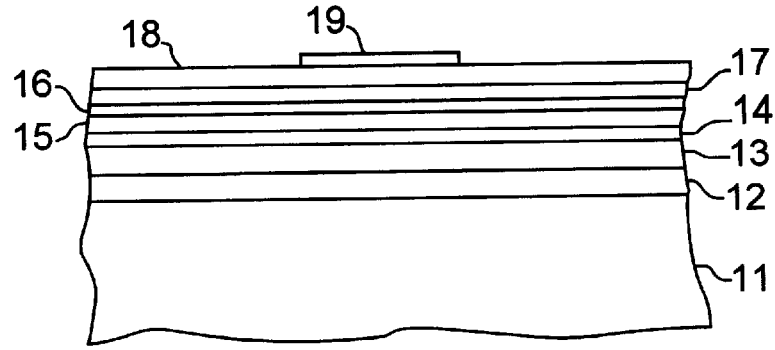
FIGS. 4 and 5 are schematic views of a portion of a typical III-V wafer that is repaired using the technique of the invention.

Referring to FIG. 4, the multilayer heterostructure stack is shown processed to the point of simulated fracture. The stack shown is a portion of a larger overall semiconductor wafer. The multilayer stack may be grown using standard growth techniques as known in the art. A general description of the MO-MBE process can be found in M. B. Panish and H. Temkin, "Gas Source Molecular Beam Epitaxy", Chapter 4, Springer Series in Materials Science, Vol. 26, Springer-Verlag 1993, which is incorporated herein by reference for details of the process. The MBE growth technique is ideal for making heterostructures because very complex multilayer stacks can be produced in a substrate wafer in a series of sequential growth steps in a vacuum apparatus without breaking the vacuum and handling the wafer. Thus all of the layers in the stack are completed before the device fabrication sequence begins.

The multilayer stack shown in FIG. 4 has been processed to the point where the emitter metal is defined. The fabrication sequence is typical for a double heterostructure bipolar transistor. The substrate layer 11 is semi-insulating InP on which a series of semiconductor layers 12–18 are sequentially grown. The first grown layer 12 is a 4000 Angstrom $In_{0.53}Ga_{0.47}As$ subcollector layer doped $n^+$ with a dopant concentration of $3 \times 10^{19}$ $cm^{-3}$. The n-type dopant used in this process was Sn, although other n-type impurities such as Si can be used. The subcollector layer 12 also includes buffer layers to prevent updiffusion of impurities in the multilayer structure. The buffer layers comprise a 200 Å $In_{0.53}Ga_{0.47}$, n-doped at a level of $1 \times 10^{18}$ $cm^{-3}$, and a 20 Å undoped $In_{0.53}Ga_{0.47}As$ layer. The collector layer 13 is a 5000 Å layer of n-InP doped to a concentration of $3 \times 10^{16}$ $cm^{-3}$.

In the heterostructure transistor described here, both the emitter-base and collector-base regions are graded using graded quaternary InGaAsP layers. The graded quaternary layers separating the collector and base is shown at 14, and comprise a 130 Å InGaAsP (1.13 eV) layer, and a 130 Å InGaAsP (0.95 eV) layer. The quaternary layers had a doping level of $1 \times 10^{17}$ $cm^{-3}$. Buffer layers comprising a 300 Å $In_{0.53}Ga_{0.47}As$ layer n-doped to $1 \times 10^{17}$ $cm^{-3}$, and a 200 Å undoped $In_{0.53}Ga_{0.47}As$ layer, separate the graded layer 14 from the base layer 15. The base layer 15 is 900 Å of $In_{0.53}Ga_{0.47}As$ doped to a concentration of $3 \times 10^{19}$ $cm^{-3}$ with carbon. The emitter side of the base also has a quaternary graded layer 16, made up of a 70 Å of InGaAsP (0.95 eV) layer, and a 70 Å InGaAsP (1.13 eV) layer. The emitter layer 17 is 500 Å of InP n-doped to a concentration of $5 \times 10^{17}$ $cm^{-3}$. The top semiconductor layer 18 is a contact layer consisting of 2500 Å of $In_{0.53}Ga_{0.47}As$ doped n-type with a concentration of $3 \times 10^{19}$ $cm^{-3}$. Emitter contact 19 is selectively applied to the semiconductor contact layer 18 by a lift-off technique. The metal contact 19 is 100 Å Pd+200 Å Pt+1000 Å Au, and during later fabrication serves as an etch mask in a self-aligning mode. The lateral dimensions of the metal layer are approximately 3×5 $\mu$m.

Figure 3:
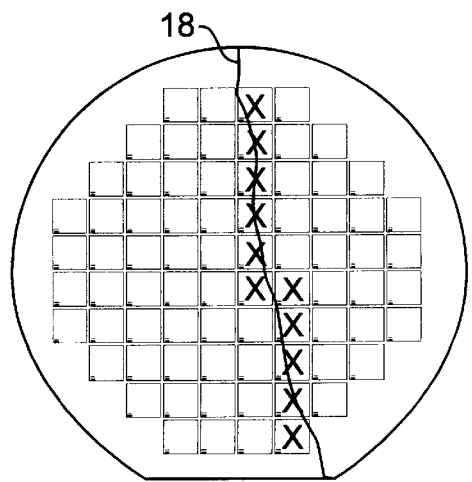
FIG. 3 shows the broken wafer of FIG. 2 bonded together using the repair technique of the invention.

The wafer, as processed to this point, was deliberately separated into two approximately equal pieces to simulate an accidental wafer breakage. The two pieces were then bonded edge-to-edge to reconstitute the original wafer, except for the fracture line, as shown in FIG. 3. The bonding process was as follows.

Photoresist was spun-on each piece at 2K RPM to obtain a 3.2 $\mu$m thick layer and then baked at 110° C. for 1 hr. The type of photoresist is not critical. AZ 4210 resist was used for the demonstration described here. Residual resist on the fracture edges was gently cleaned with acetone. The wafer was bonded edge-to-edge using Miller-Stephenson's Epoxy 907, with equal parts of A and B mixed just prior to application. A small bead of epoxy was applied to the edge of one piece. Both pieces were placed side-by-side in a Teflon vacuum chuck with the fracture line aligned. The pieces were urged together until a small bead of epoxy appeared along the top surface which insured there were no voids between the pieces. A bead of epoxy formed along the bottom edge of the fracture line, on the bottom side of the wafer but, conveniently, the epoxy does not adhere to the Teflon support. If the fracture is irregular, the pieces tend to self align when urged together. Alternatively, the vacuum chuck can be placed under a microscope, and the wafer aligned to the original pattern. Then vacuum is applied to the vacuum chuck and the wafer is heated on a hot plate at 100° C. for 12 hours to cure the epoxy. After curing, the wafer was removed from the chuck and excess epoxy was removed from the back side of the wafer with a razor blade. Since the front side of the wafer was previously coated with photoresist, excess epoxy from the front side can be removed using lift-off by removing the photoresist with a conventional photoresist solvent, e.g. acetone.

Figure 5:
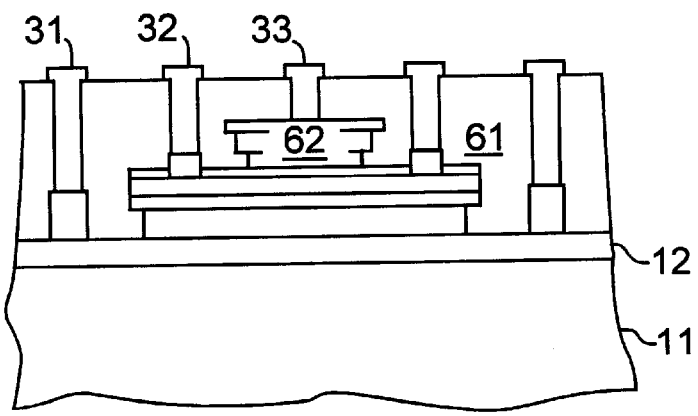

After bonding, the wafer was re-inserted into the fabrication line and the standard wafer fabrication sequence was completed. The completed device structure is shown in FIG. 5. The finished device has substrate 11, collector contact layer 12, the collector-base stack, indicated generally at 61, which comprises collector, graded collector-base region, base, and graded base-emitter region, and the emitter stack, indicated generally at 62, which comprises emitter, emitter contact layer, and emitter metallization. The collector, base, and emitter metal contacts are shown at 31, 32, and 33 respectively.

The critical steps in the processing, after the fracture repair, are the lithography steps used to pattern the collector and base stacks, and the contacts. It was determined that the registration marks for every IC chip site on the repaired wafer were within the ±0.125 $\mu$m registration tolerance of the stepper.

To evaluate the durability of the adhesive bond, the wafer was subjected to different processing steps to simulate a wide range of processing conditions. The pattern was checked after each step by patterning the wafer with the stepper, then stripping the exposed resist with acetone spray. The steps evaluated were:

1. Soak in 1:10 $HCl:H_2O$ for 5 min., rinse in $H_2O$;
2. Soak in acetone overnight, rinse in methanol and then isopropanol;
3. Deposit two coats of spin-on glass, cure at 300° C./10 min. for each coat. Then deposit $SiO_2$ by plasma enhanced chemical vapor deposition (PECVD) at 150° C.;
4. Soak in buffered HF (7:1) for 1 hr to remove glass and $SiO_2$;
5. Deposit polyimide and bake at 90° C., 150° C., and 230° C., for 1 hr each.

These steps simulate the process for oxide removal prior to metal deposition, metal lift-off, device encapsulation and passivation, and formation of crossovers. These steps also show the resistance of the epoxy to all of the chemicals used in typical semiconductor wafer processing, and the tolerance of the epoxy to the strains from thermal mismatch through multiple thermal cycles.

As will be evident to those skilled in the art, the invention relies on the use of a step and repeat camera for the lithography steps in the wafer fabrication sequence. It also relies on the ability of the step and repeat camera to reregister the mask image to registration marks on each IC device site after each step and repeat cycle. Typical steppers are conventionally designed with this feature. In the usual case the stepper will be a photolithographic stepper, typically a deep UV stepper, but the invention applies also to lithographic fabrication using e-beam or x-ray exposure tools.

Use of these lithographic tools also depends on the presence of alignment marks on each IC site to which the camera automatically registers. These alignment marks are typically formed on the wafer being fabricated in the first processing step, and the same marks are then used throughout the fabrication sequence for stepper alignment in each lithography step. This technology is well known in the art, and the cameras and mask making tools necessary for wafer fabrication are widely available commercially.

The means used to join the fractured wafer segments in the foregoing demonstration was epoxy but any appropriate adhesive material that is capable of withstanding the processing conditions typically used in wafer fabrication can be used. Epoxy is a preferred adhesive because of the successful demonstrations detailed above.

The technique of the invention is also suited for the production of monolithic integrated circuit devices which combine different substrate materials. For example, a substrate chip of InP can be bonded edge to edge to a substrate chip of GaAs thus enabling device structures to be built in one substrate material or the other depending on the optimum substrate properties for the device. This embodiment of the invention is represented on a wafer scale in FIG. 6. Prior to device fabrication, wafer 64 is formed by bonding sections of a wafer together using the procedure described above. Sections 66 are made of e.g. GaAs, and sections 67 are made of e.g. InP. The individual sections are conveniently formed by scribing the sections from two whole wafers. The wafers are typically substantially circular in shape (except for the "flat") and the scribe lines forming the section used in the technique of the invention will typically correspond to chords of the wafer. In this context the term chord is meant to include a diameter. It will also be appreciated that it is convenient if the wafers from which the sections are scribed and the reconstituted hybrid wafer all have the same shape and dimensions.

Wafer material can be conserved by alternating sections in a bonded wafer, i.e. the GaAs wafer provides sections 66 for one hybrid wafer and sections 67 for the next hybrid wafer, thus utilizing the entire GaAs wafer. The masks can be inverted so that the same pairing of materials is used for device fabrication.

Figure 6:
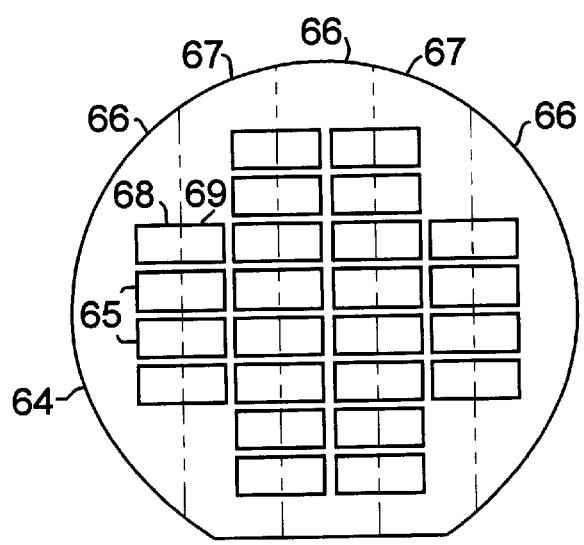
FIG. 6 is a schematic representation of a hybrid semiconductor wafer fabricated using the technique of the invention.

In FIG. 6 the multiple chip sites are shown at 65, each of which consists of a GaAs section 65 and an InP section 69. Those skilled in the art will appreciate that in the arrangement described the side by side orientation of GaAs—InP alternates between rows, i.e. row with chips 65 has GaAs on the left and InP on the right, while the adjacent row has the mirror image. The masks or the exposure tools can be tailored to accommodate this arrangement.

Device fabrication using hybrid semiconductor wafers can then utilize the desirable properties of different semiconductor materials. For example, in the GaAs—InP combination, transistor devices can be formed in the GaAs section and photonic devices can be formed in the InP section. The GaAs transistors can be used e.g. as drivers for InP laser devices. Interconnections can be made between devices as if the chip site was of a single material.

A similar form of device integration with hybrid semiconductor chip sites can be implemented according to the invention using p-type material bonded edge-to-edge with n-type material.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Method for the manufacture of semiconductor wafers in which the semiconductor wafers have a multiplicity of IC device sites arranged in a pattern on the semiconductor wafer, and each of said IC device sites has a set of alignment marks, the method comprising:
   a. passing the semiconductor wafer being fabricated through a sequence of wafer fabrication steps in a processing line, said steps including a multiplicity of step and repeat lithography steps, said step and repeat lithography steps comprising exposing each IC site to a lithographic pattern using a step and repeat camera, and aligning the lithographic mask to each IC chip site using said alignment marks,
   b. removing a fractured wafer from said processing line after exposure of said wafer to at least one step and repeat lithography step, said fractured wafer consisting of at least two pieces with each of said pieces having a fracture edge corresponding to the fracture line of said wafer, and said fracture line intersecting a multiplicity of said IC device sites,
   c. applying an adhesive material to the said fracture edge of at least one of said pieces,
   d. placing said pieces together with said fracture edges in contact,
   e. aligning said fracture edges,
   f. curing said adhesive material to produce a repaired wafer,
   g. reinserting said repaired wafer into said processing line, and
   h. exposing said repaired wafer to at least one of said step and repeat lithography steps.

2. The method of claim 1 in which the step and repeat lithography steps are photolithography steps.

3. The method of claim 1 in which the step and repeat steps are selected from the group consisting of e-beam and x-ray lithography.

4. The method of claim 1 in which the semiconductor wafer is a III-V semiconductor wafer.

5. The method of claim 4 in which the semiconductor wafer is selected from the group consisting of InP, GaAs, and combinations thereof.

6. The method of claim 1 in which the adhesive material is epoxy.

7. The method of claim 1 in which the fractured wafer consists of two pieces.

8. The method of claim 1 in which the sequence of fabrication steps is at least 25% complete when the fractured wafer is removed from the processing line.

9. The method of claim 5 in which the said IC devices in the said IC device sites are double heterostructure bipolar transistors.

10. The method of claim 1 wherein the repaired wafer has the same thickness as the original wafer.

11. The method of claim 1 including the additional step, after step b, of coating at least one surface of each of the said pieces with photoresist, and removing the photoresist after step f. thereby lifting off excess adhesive material from said surface.

12. Method for the manufacture of hybrid semiconductor wafers in which the hybrid semiconductor wafers comprise a section of a first semiconductor material adjacent to a section of a second semiconductor material, wherein said first and second semiconductor materials are different, said hybrid semiconductor wafer having a multiplicity of IC device sites arranged in a pattern on the semiconductor wafer, with each of said IC device sites including a section of said first semiconductor material and a section of said second semiconductor material, the method comprising:

a. scribing a first section of semiconductor material from a first semiconductor wafer to produce a first scribed semiconductor section having a scribed edge,
   b. scribing a second section of semiconductor material from a second semiconductor wafer to produce a second scribed semiconductor section having a scribed edge, said first and second semiconductor wafers consisting of different semiconductor materials,
   c. applying an adhesive material to the said scribed edge of said first one of said scribed semiconductor sections,
   d. placing said first and second scribed semiconductor sections together with said scribed edges in contact, and
   e. curing said adhesive material to produce said hybrid semiconductor wafer.

13. The method of claim 12 further including passing said hybrid semiconductor wafer through a sequence of wafer fabrication steps in a processing line, said steps including a multiplicity of step and repeat lithography steps, said step and repeat lithography steps comprising exposing each IC site to a lithographic pattern that exposes simultaneously at least a portion of said first and second scribed semiconductor sections.

14. The method of claim 12 in which adhesive material is applied to both of said scribed edges.

15. The method of claim 12 in which the adhesive material is epoxy.

16. The method of claim 12 in which the said first semiconductor materials is GaAs.

17. The method of claim 12 in which the said first semiconductor material is InP.

18. The method of claim 16 in which the said second semiconductor material is InP.

19. The method of claim 12 in which the said scribed sections are formed by scribing along scribe lines corresponding to chords of said wafers.

20. The method of claim 19 in which at least two chords of a semiconductor wafer are scribed to form at least two of said scribed semiconductor sections and the two scribed semiconductor sections are used to form two different hybrid semiconductor wafers.

21. The method of claim 12 in which said first and second semiconductor wafers and said hybrid semiconductor wafer have essentially the same shape and dimensions.

* * * * *